United States Patent
Inam et al.

(10) Patent No.: US 11,758,700 B1
(45) Date of Patent: Sep. 12, 2023

(54) INDIRECT IMPINGEMENT LIQUID COOLING FOR STATIC SYNCHRONOUS SERIES COMPENSATOR SYSTEMS

(71) Applicant: Smart Wires Inc., Union City, CA (US)

(72) Inventors: Haroon Inam, San Jose, CA (US); Ali Farahani, Yorba Linda, CA (US); Mohammad Dehsara, Union City, CA (US)

(73) Assignee: Smart Wires Inc., Durham, NC (US)

( * ) Notice: Subject to any disclaimer, the term of this patent is extended or adjusted under 35 U.S.C. 154(b) by 8 days.

(21) Appl. No.: 17/450,132

(22) Filed: Oct. 6, 2021

Related U.S. Application Data

(60) Provisional application No. 63/211,429, filed on Jun. 16, 2021.

(51) Int. Cl.
*H05K 7/20* (2006.01)

(52) U.S. Cl.
CPC ................................ *H05K 7/20927* (2013.01)

(58) Field of Classification Search
CPC .................................................. H05K 7/20927
See application file for complete search history.

(56) References Cited

U.S. PATENT DOCUMENTS

| | | | |
|---|---|---|---|
| 6,822,866 B2* | 11/2004 | Fearing | H05K 7/209 165/286 |
| 8,345,423 B2* | 1/2013 | Campbell | F28D 15/0233 257/714 |
| 9,445,526 B2* | 9/2016 | Zhou | H05K 7/20927 |

FOREIGN PATENT DOCUMENTS

WO    WO-2012043938 A1 *   4/2012   ............... H02J 3/06

OTHER PUBLICATIONS

WO 2012043938 A1_ENG, English Translation of WO 2012043938 (Year: 2012).*

\* cited by examiner

*Primary Examiner* — Mukundbhai G Patel
(74) *Attorney, Agent, or Firm* — Womble Bond Dickinson (US) LLP

(57) ABSTRACT

A liquid cooling static synchronous series compensator (SSSC) system has inverter valve modules, inverter valve units and liquid cooling blocks. Liquid cooling blocks may be configured to provide a jetted flow, a parallel flow or an individualized flow, within an enclosed fluid chamber, for cooling inverter valve units. Liquid cooling blocks may have voltage isolation.

19 Claims, 13 Drawing Sheets

INDIRECT IMPINGEMENT LIQUID COOLING FOR STATIC SYNCHRONOUS SERIES COMPENSATOR SYSTEMS

CROSS REFERENCE TO RELATED APPLICATIONS

This application claims the benefit of U.S. Provisional Application No. 63/211,429 filed on Jun. 16, 2021, the disclosure of which is incorporated herein by reference.

TECHNICAL FIELD

Embodiments of the disclosure relate to liquid cooled high power semiconductor devices used in a static synchronous series compensator (SSSC) system.

BACKGROUND

A flexible alternating current transmission system (FACTS) provides enhanced controllability and power transfer capability of a high voltage AC transmission system. A static synchronous series compensator (SSSC) is a key component of FACTS. The SSSC injects a leading or lagging voltage into the AC transmission line providing the functionality of a series capacitor or series reactor respectively, i.e., the SSSC pushes power away from or pulls more power towards the circuit on which the SSSC is installed.

The SSSC incorporates a voltage-source converter (VSC) which operates in series with the AC transmission line. The VSC is used to generate and inject an AC voltage in series with the transmission line and if the voltage is in phase quadrature with the transmission line current, the VSC supplies or consumes variable reactive power. The VSC includes switching elements and DC capacitors. The unidirectional voltages of the DC capacitors are converted to an injected AC voltage through control of the switching elements where the injected AC voltage is controlled in magnitude as well as its phase relationship to the AC system voltage. When the injected AC voltage is in phase quadrature with reference to the AC transmission current, leading or lagging, the VSC is used to absorb or supply reactive power. Since the VSC generates an AC voltage from a DC voltage, the VSC is also referred to as an inverter, even though the VSC has the capability to transfer power in either direction.

The VSC includes one or more inverter valve units (IVUs) each having switching elements arranged in a full H-bridge (FHB) configuration. The switching elements include but are not limited to gate-controlled power semiconductor devices, insulated gate bipolar transistors (IGBTs), metal-oxide semiconductor field effect transistors (MOSFETs) or other similar devices. In the case of IGBTs, a diode referred to as a freewheeling diode is placed anti-parallel with the IGBT and conducts current in the opposite direction. The switching elements are connectedly arranged in series where each of the switching elements maintains a portion of the voltage applied to the inverter. A controller provides signals to drive the switching elements.

In an embodiment, IGBTs are the semiconductor devices used for the inverter valve unit. Their transistor characteristics require low drive current, and they provide fast current turn-on and turn-off capability. A high-power switching module increases the current handling capability by combining multiple IGBTs within a packaged module. The high-power switching module includes IGBTs and freewheeling diodes mounted on a ceramic substrate which is attached onto a metal baseplate. The metal baseplate provides mechanical support and heat transfer for the packaged module. For heat transfer the metal baseplate absorbs the heat losses of the IGBT devices and then transmits the heat to an external thermally coupled cooling system.

Thermal management is mandatory to reduce failure of the high-power switching module while operating within its predesigned range, particularly for high voltage systems operating at power exceeding 10,000 watts. High power IGBTs generate significant heat loss, the heat loss can be divided into two categories—conduction loss and switching loss. The conduction losses occur during the on-state voltage drop across the IGBTs depending on the conducted current. The switching power losses occur during on and off stages of the IGBTs depending on the duty cycle and switching frequency.

There are a variety of thermal management options for high-power switching modules including air-cooling which is the simplest with low cost. Air-cooling functions to release the heat to the ambient air by transferring heat from the high-power switching module to a heat sink via the metal baseplate where the heat can be taken away via air convection. Heat sink materials such as arrays or other extruded surfaces with high thermal conductivities like aluminum or copper are used to exchange the heat between the high-power switching module and the ambient air. Air cooling however requires larger physical dimensions since the heat exchange between the heat sink materials and air is mainly dependent on the contact area. Further air cooling adds mechanical constraints requiring the placement of the high-power switching module near the ambient air-exposed heat sink surfaces.

A liquid cooling system offers a more favorable option because liquid cooling generally provides superior cooling efficiency compared to air cooling. Several liquid cooling systems including direct impingement liquid cooling provide high heat transfer and low thermal resistance for the high-power switching module. The liquid coolant may be distilled water mixed with ethylene glycol, or propylene glycol or other liquids having good thermal conduction. The use of water-based cooling however is problematic where the water is in proximity to high voltages (e.g., around 1,500 volts) producing high electric fields which promote ionization of the water. Ionized water in turn will dissolve materials it comes in contact with, potentially causing leaks and fluid blockages within the cooling system as well as other safety and reliability problems.

Conventional SSSCs are ground based systems due to their size and collateral connection requirements They are housed in substantially large metal enclosures and may be installed within a substation building. For ground based SSSCs operating at a lower voltage, such as less than 1,500 volts, there is less concern of water ionization and a liquid cooling system offers a favorable thermal management option compared to air cooling. However, SSSCs operating at a lower voltage require additional electronics and components such as step-up transformers for connection to the transmission line voltage—hence adding costs and potentially reduced system reliability.

Further, transmission distribution lines may be in areas that have land access constraints or other issues that preclude construction of a dedicated substation building due to cost, legal or environmental issues. It is therefore desirable for an SSSC to be installed on transmission towers within the transmission right-of-way or conveniently situated in banks inside or nearby existing substations. SSSCs installed on transmission towers with liquid cooling would offer a preferred thermal management system since they provide higher cooling efficiency with smaller physical dimensions. However, the proximity of high voltages, typically exceeding 1,500 volts is problematic for liquid cooling due to problems related to water ionization. It is under such considerations that present embodiments arise.

SUMMARY

Various embodiments of a liquid cooling static synchronous series compensator system are described herein. Liquid cooling blocks provide liquid cooling to cool inverter valve units through indirect impingement of liquid coolant. Some embodiments are configurable, through multiple liquid cooling block sections. Some embodiments are configurable, through multiple cooling plates. Some embodiments are configured with a specific liquid cooling block section. Some embodiments are configured with a specific cooling plate. Some embodiments have voltage isolation of liquid cooling blocks, to limit or prevent water ionization in proximity to high voltage.

One embodiment of a liquid cooling static synchronous series compensator system has one or more series connected inverter valve modules, which are operable to inject reactive power into a power transmission line. Each inverter valve module includes one or more inverter valve units attached to a liquid cooling block. The liquid cooling block has an enclosed fluid chamber. The liquid cooling block is configurable, via multiple liquid cooling block sections and multiple cooling plates. By being configurable, the liquid cooling block is to provide each of a jetted flow, a parallel flow and an individualized flow.

One embodiment of a liquid cooling static synchronous series compensator system has multiple, series-connectable inverter valve modules. Each inverter valve module includes at least one inverter valve unit and at least one liquid cooling block. The liquid cooling block(s) of each inverter valve module have voltage isolation relative to liquid cooling block(s) of other inverter valve modules of the system. The liquid cooling block(s) is configured to provide a flow within an enclosed fluid chamber, for cooling the inverter valve unit(s). The flow that the liquid cooling block is configured to provide is from among a jetted flow, a parallel flow, and an individualized flow.

DETAILED DESCRIPTION

Figure 1:
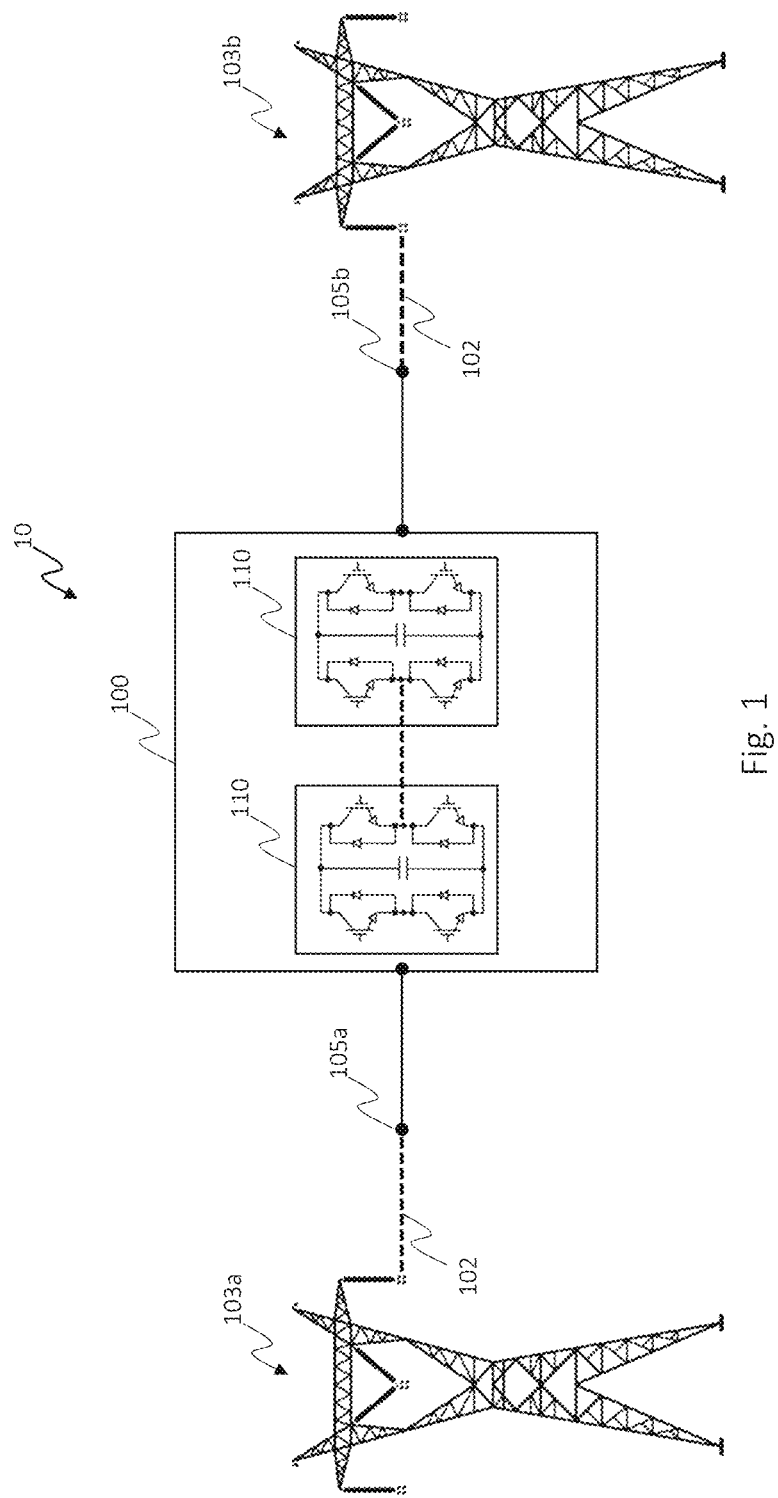
FIG. 1 illustrates an example power transmission system according to an embodiment.

A liquid cooling block (LCB) is described for cooling high-power semiconductor devices used in a static synchronous series compensator (SSSC) system. The LCB has an outside surface and an enclosed fluid chamber. One or more high-power switching modules are mounted onto the outside surface of the liquid cooling block. The enclosed fluid chamber contains the liquid coolant and is configured to provide indirect impingement. Voltage isolation of the liquid cooling block prevents ionization of the liquid coolant and enables various configurations of series and parallel connected inverter valve units to provide a desired level of injected reactive voltage into a power transmission line.

A static synchronous series compensator injects a leading or lagging voltage into the AC transmission line. The SSSC is housed in a metal enclosure which may be installed on transmission towers within the transmission right-of-way or alternatively inside an existing substation. The SSSC includes one or more inverter valve units (IVUs), which have high-power switching semiconductor devices arranged in a full H-bridge (FHB) configuration. In one embodiment, insulated gate bipolar transistors (IGBTs) are the semiconductor devices used for the inverter valve unit. A high-power switching module allows increasing the current handling capability by combining multiple IGBTs within a packaged module. The high-power switching module includes IGBTs and freewheeling diodes mounted on a ceramic substrate that is attached onto a metal baseplate, in one embodiment. The metal baseplate provides mechanical support and heat transfer for the high-power switching module. An example switching module is the Mitsubishi Electric CM1000DX(P)-24T having a nickel-plated copper metal baseplate.

A first aspect of the present disclosure relates to thermal management of the high-power switching module by way of a liquid cooling block (LCB). A liquid cooling system using the liquid cooling block provides higher cooling efficiency and reduces the physical dimensions of the SSSC. One or more high-power switching modules are mounted onto the liquid cooling block(s) and the use of a liquid cooled system increases the cooling efficiency compared to an air-cooled system. The LCB includes a fluid inlet port, a fluid outlet port and is thermally coupled to a radiator for radiating heat to the ambient air. A pump is used to circulate a liquid coolant within the LCB and the radiator thereby creating a closed-circuit liquid cooling system.

A second aspect of the present disclosure eliminates problems related to water ionization by way of voltage isolation. Each inverter valve unit comprises one or more high-power switching modules mounted onto the outside planar surface of the liquid cooling block. Voltage isolation of the inverter valve units limits ionization of the liquid coolant and enables combinations of series and parallel connected inverter valve units to provide a desired level of injected reactive voltage into a power transmission line. Since the LCB has no ground connection and the voltages within inverter valve units is maintained at less than 1,500 volts, ionization of the liquid coolant within the liquid cooling block and the closed-circuit fluid system is thereby minimized. To further limit ionization, adjacent inverter valve units are physically spaced apart with an adequate separation distance and insulating materials are used. The insulating materials may include fiber reinforced plastic (FRP) or nylon for example, and the separation distance may be greater than eight (8) mm for example.

The LCB has a planar outside surface and an enclosed fluid chamber. One or more high-power switching modules are thermally coupled to the planar outside surface. The high-power power electronic module uses high-current devices, such as insulated gate bipolar transistors (IGBTs). The enclosed fluid chamber contains the liquid coolant and may be configured to provide jetted flow and parallel flow. The LCB further includes a fluid input port and a fluid output port—combined with the fluid chamber to form a closed-circuit system. One or more pumps assist to circulate the liquid coolant and the LCB may be thermally coupled to a fan radiator for radiating heat to an air ambient.

In an embodiment, the liquid cooling block (LCB) is formed via a clamshell construction comprising a first section coupled to a second section enclosing a fluid chamber within. The two LCB sections may be welded, brazed or attached in other ways. The LCB second section includes a planar outside surface and an inside surface forming a portion of the enclosed fluid chamber. One or more high-power switching module are mechanically fastened and thermally coupled to the LCB planar outside surface of the LCB second section. Indirect impingement cooling occurs when the liquid coolant impinges onto the LCB second section inside surface, such that heat is transferred from the power electronic module metal baseplate indirectly by the LCB second section to the liquid coolant via the enclosed fluid chamber.

In an embodiment, to provide a jetted flow, the LCB first section includes a showerhead located within the enclosed fluid chamber. The showerhead includes an array of jetting apertures comprising one or more rows of jetting apertures. Jets of liquid coolant created by the showerhead are jetted onto the LCB second section inside surface.

In an embodiment, to provide a parallel flow, the LCB first section includes a parallel slot rather than a jetting aperture. For a LCB using parallel flow, the liquid coolant flows from a parallel slot in the LCB first section into the enclosed fluid chamber and subsequently flows over the LCB second section inside surface.

In another embodiment, the LCB may be configured to provide an individualized flow using a cooling plate. One or more high-power switching module are mounted on the planar outside surface of the LCB second section. A cooling plate is fit-mounted into an aperture in the planar outside surface of the LCB second section and may be welded, brazed or attached in other ways. The cooling plate has a planar outward facing surface and an inward facing patterned or unpatterned surface. When configured to provide jetted flow, jets of liquid coolant created by the LCB first section showerhead are jetted onto the cooling plate inward facing patterned or unpatterned surface. When configured to provide parallel flow, the liquid coolant flows over the cooling plate inward facing patterned or unpatterned surface.

In a first cooling plate configuration, the cooling plate's inward facing surface comprises an un-patterned flat surface. In a second cooling plate configuration, the inward facing surface comprises embossed features (or patterns) having vertically oriented features. In a third cooling plate configuration, the inward facing surface comprises embossed features (or patterns) having horizontally oriented features. In a fourth cooling plate configuration, the inward facing surface comprises embossed features (or patterns) having square oriented features. In a fifth cooling plate configuration, the inward facing surface comprises embossed features (or patterns) having trapezoidal oriented features. The embossed features increase the surface area on which the coolant jets impinge, thereby leading to improved heat transfer.

FIG. 1 illustrates an example power transmission system according to an embodiment. In FIG. 1, power transmission system 10 includes a static synchronous series compensator (SSSC) 100, a power transmission line 102, and transmission line towers 103a and 103b. SSSC 100 may be configured to provide 10 MVAr (megavolt amps reactive) of reactive power for injection into a power transmission line for example. The SSSC 100 is series connected into power transmission line 102 and may be supported by a transmission line tower 103 within the transmission right-of-way or inside a nearby substation. Power transmission line 102 may include a high-voltage transmission line (e.g. as high as 500 kV, kilovolts), a medium-voltage transmission line (e.g. 230 kV) or a distribution line (e.g. 13 kV). The SSSC 100 includes a plurality of inverter valve units (IVUs) 110 operatively connected in series and parallel combinations to provide a desired level of injected reactive voltage into a power transmission line 102. Terminals 105a and 105b are shown for connecting the SSSC 100 to the power transmission line 102.

Figure 2:
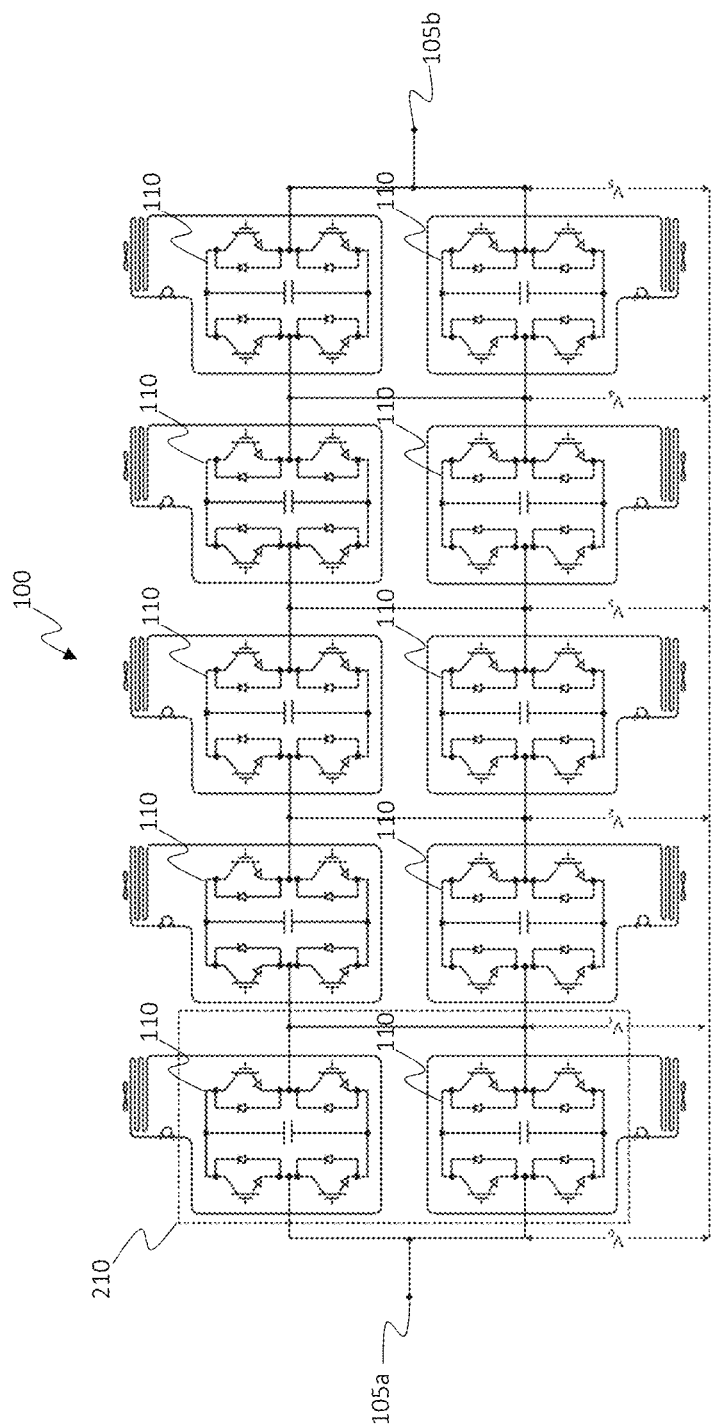
FIG. 2 illustrates a block diagram of an example static synchronous series compensator according to an embodiment.

FIG. 2 is a block diagram illustrating an example static synchronous series compensator. Referring to FIG. 2, SSSC 100 injects a leading or lagging voltage into the power transmission line 102, through terminals 105a and 105b. The SSSC 100 includes a plurality of inverter valve units 110 operatively connected in series and parallel to provide a desired level of injected reactive voltage into power transmission line 102. The embodiment shown in FIG. 2 includes ten inverter valve units 110, though SSSC 100 may include more or less than ten inverter valve units 110, connected in various series and parallel combinations in some embodiments.

In the embodiment shown in FIG. 2, SSSC 100 includes 5 series connected inverter valve modules 210, each injecting reactive power into the power transmission line 102, 0.8 kV for example, though this voltage may be greater in other embodiments. Each inverter valve module 210 comprises two parallel connected inverter valve units 110 wherein the two parallel connected inverter valve units 110 are used to increase the injected current. Further SSSC embodiments could have fewer or more series connected inverter valve modules 210, for example ten series connected inverter valve modules 210 for a total of twenty inverter valve units 110 in an SSSC.

The input potential at the first inverter valve module is shown as node V0, and the output potential is shown as node V1. Each voltage V1, V2, V3, V4, V5, exceeds a prior voltage level by the amount of voltage injection by each inverter valve module 210, 0.8 kV for example. The series connection of the inverter valve modules 210 is required to achieve the desired level of injection of reactive power into the power transmission line 102 connected at terminals 105a and 105b. At node V5, the level of injected reactive power into the power transmission line 102 is 5×0.8 kV i.e. 4,000 kV in this example.

Figure 3:
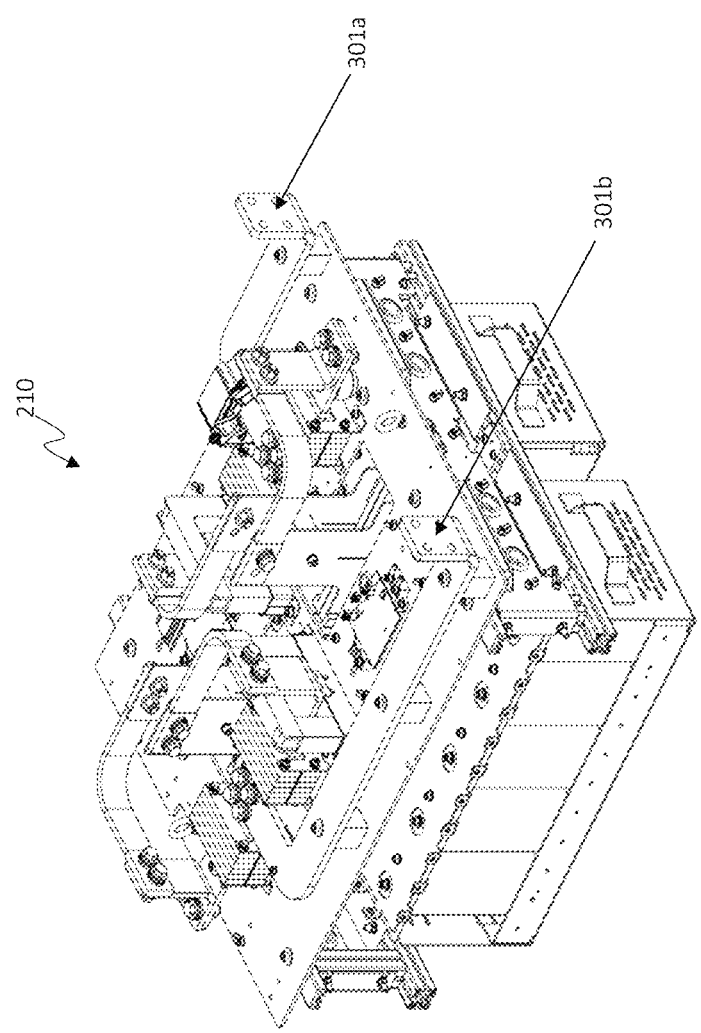
FIG. 3 is a perspective view of an inverter valve module according to an embodiment.

FIG. 3 is a perspective view of an inverter valve module according to an embodiment. Terminals 301a and 301b denote connection points for the input potential, e.g., node V0 and the output potential, e.g., node V1 respectively.

Figure 4:
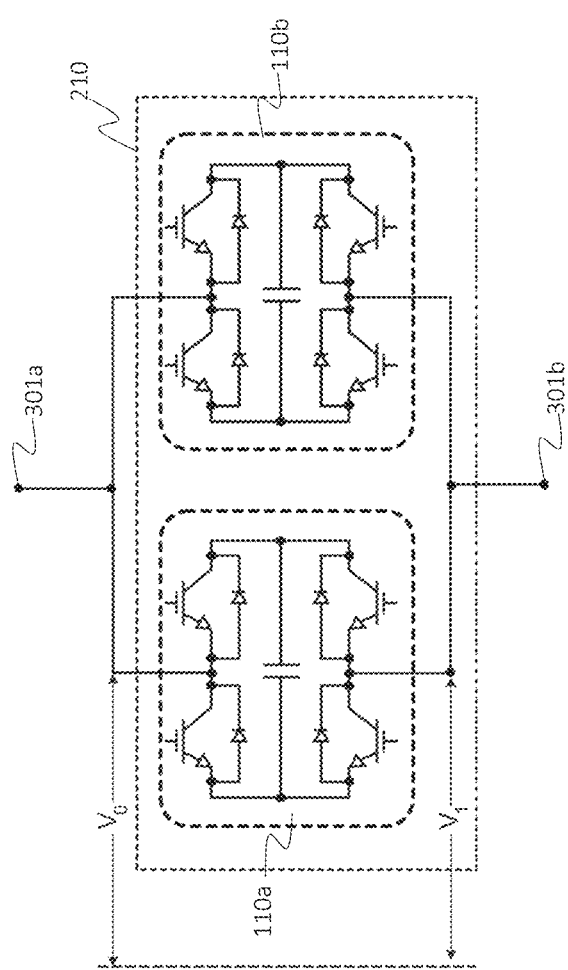
FIG. 4 is a simplified block diagram illustrating an inverter valve module according to an embodiment.

FIG. 4 is a simplified block diagram illustrating an inverter valve module according to an embodiment. In FIG. 4, inverter valve module 210 includes two parallel connected inverter valve units 110a and 110b, though one or more than two inverter valve units 110 connected in parallel may be used in some embodiments. The capacitors shown in the figure represent a bank of DC capacitors. Terminals 301a and 301b denote connection points for the input potential, e.g., node V0 and the output potential, e.g., node V1, respectively. At node V1, the level of injected reactive power is 0.8 kV in this example, though this voltage may be greater in other embodiments.

Figure 5:
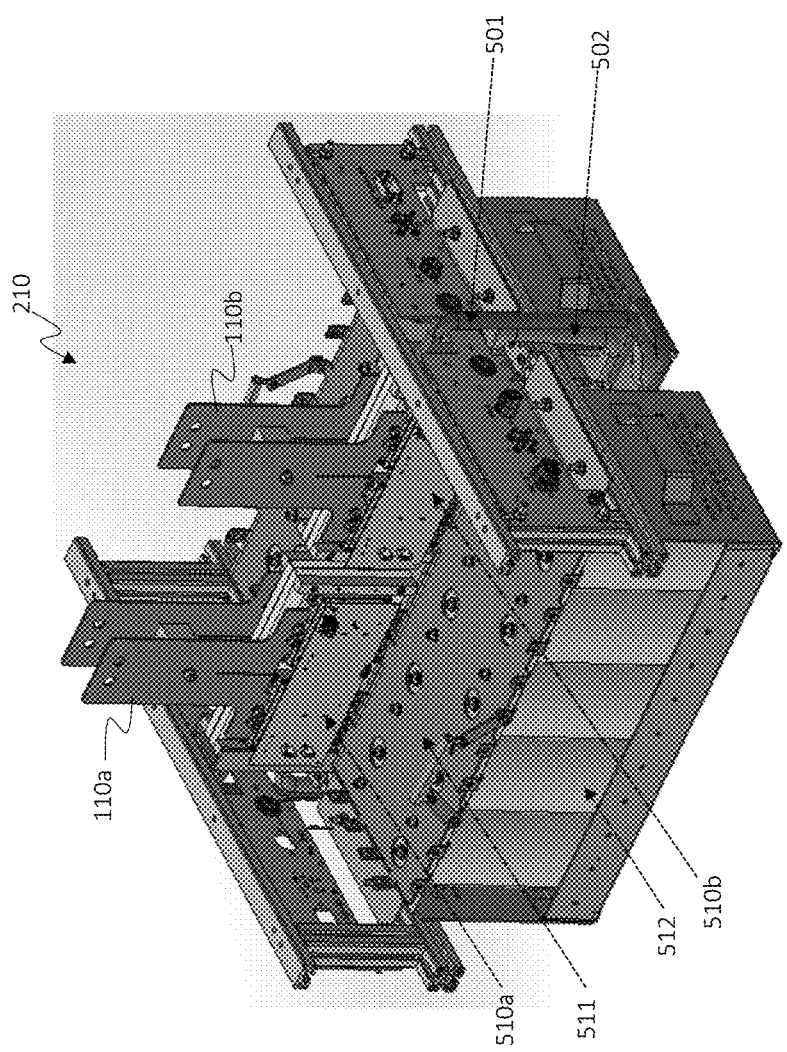
FIG. 5 illustrates a partially disassembled an inverter valve module according to an embodiment.

FIG. 5 illustrates a partially disassembled inverter valve module according to an embodiment. In FIG. 5, inverter valve module 210 includes two parallel connected inverter valve units 110a and 110b. Inlet tube 501 and outlet tube 502 carry liquid coolant to the LCBs fluid inlet port and outlet port that are hidden behind printed circuit boards 510a and 510b, with each circuit board 510a and 510b having control circuits for the high-power switching modules associated with the corresponding inverter valve unit. Capacitor bank 512 and DC bus 511 are also shown. The inverter valve module 210 may include structural members fabricated using non-electrically conductive materials such as fiber reinforced plastic (FRP). One version of FRP comprises a polyester resin and has an operating temperature up to around 140° F., for example. Another version of FRP comprises an epoxy resin and has an operating temperature up to around 240° F., as an example. Although not required for voltage isolation, the tubing of inlet tube 501 and outlet tube 502 for circulating the coolant may comprise a non-electrically conductive material such as silicone.

Figure 6:
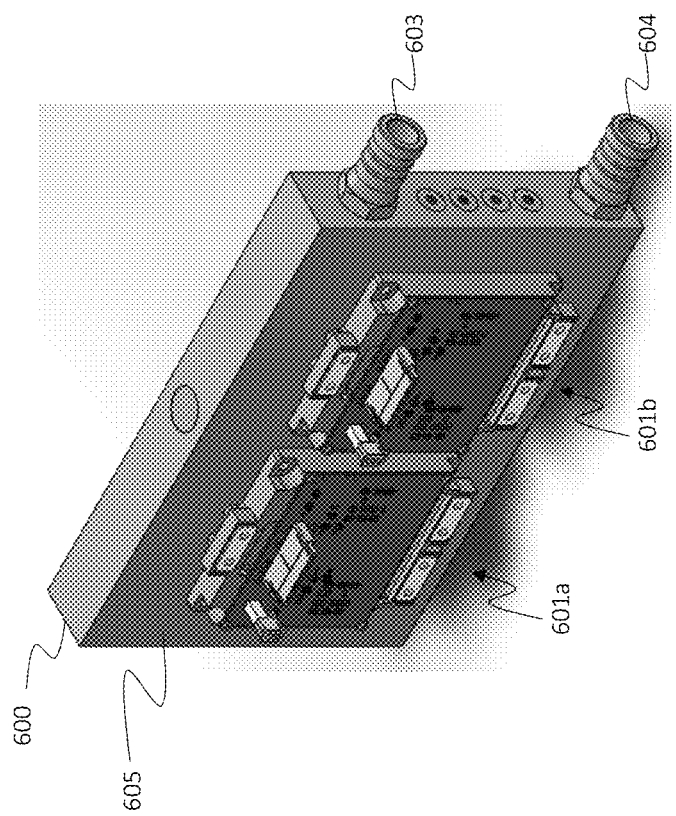
FIG. 6 illustrates a partially disassembled inverter valve unit (IVU) according to an embodiment.

FIG. 6 illustrates a partially disassembled inverter valve unit 110. In FIG. 6, two high-power switching modules 601a and 601b are mechanically fastened to the liquid cooling block (LCB) 600 planar outside surface 605. A suitable example of a high-power switching module is the Mitsubishi Electric CM1000DX(P)-24T having a nickel-plated copper metal baseplate. A fluid inlet port 603 and a fluid outlet port 604 are also shown.

Figure 7:
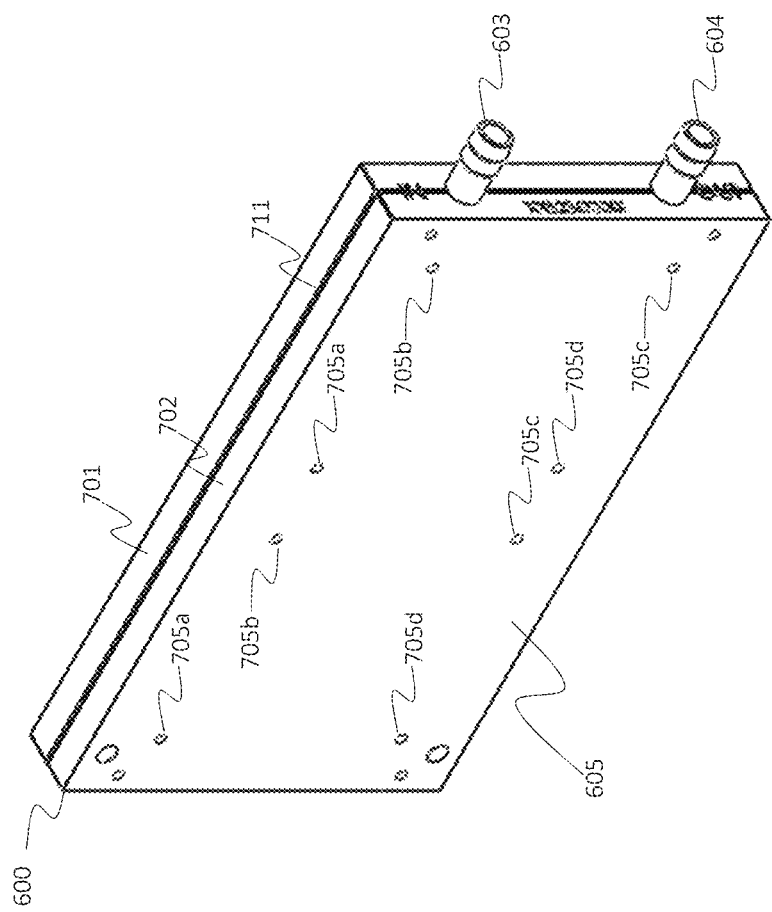
FIG. 7 illustrates an example liquid cooling block (LCB) according to an embodiment.

FIG. 7 illustrates a liquid cooling block (LCB) according to an embodiment. In FIG. 7, LCB 600 has a clam shell construction, a first section 701 and a second section 702 may be welded together to form interface 711. Each section of the LCB 600 is accessible for machining a shaped internal cavity to form an enclosed fluid chamber. A fluid inlet port 603 and a fluid outlet port 604 are shown. The planar outside surface 605 is located on the second section 702. Two sets of four threaded mounting holes, 705a, 705b, 705c and 705d are provided for fastening the high-power switching modules. An alternative manufacturing method is to fabricate a liquid cooling block using polymer material including metal plates at the thermal interfaces.

Figure 8:
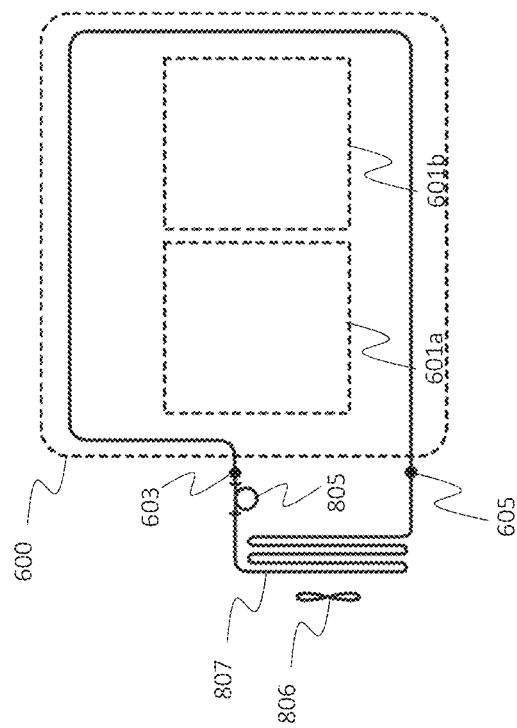
FIG. 8 illustrates an example closed-circuit liquid cooling system according to an embodiment.

FIG. 8 illustrates an example closed-circuit liquid cooling system according to an embodiment. In FIG. 8, LCB 600 includes a fluid inlet port 603 and a fluid outlet port 604 coupled to the closed-circuit liquid cooling system. A pump 805 is used to circulate a liquid coolant within the closed-circuit liquid cooling system. The LCB 600 is thermally coupled to one or more fans 806 and a radiator 807 for radiating heat to the ambient air. Some embodiments have redundant fans 806. The liquid coolant may be a combination of one or more of distilled water, de-ionized water, ethylene glycol, and polyethylene glycol for example, although any suitable liquid coolant may be used. The liquid coolant may have an operating pressure (less than 2 bar for example) and may be compatible with an operating temperature (e.g., −40° C. to 50° C.). The amount of liquid coolant required for an inverter stage may be less than 10 liters for example, but may be more or less in other embodiments. The liquid coolant may be replaceable or may be contained in a sealed manner that does not require replacement.

Figure 9:
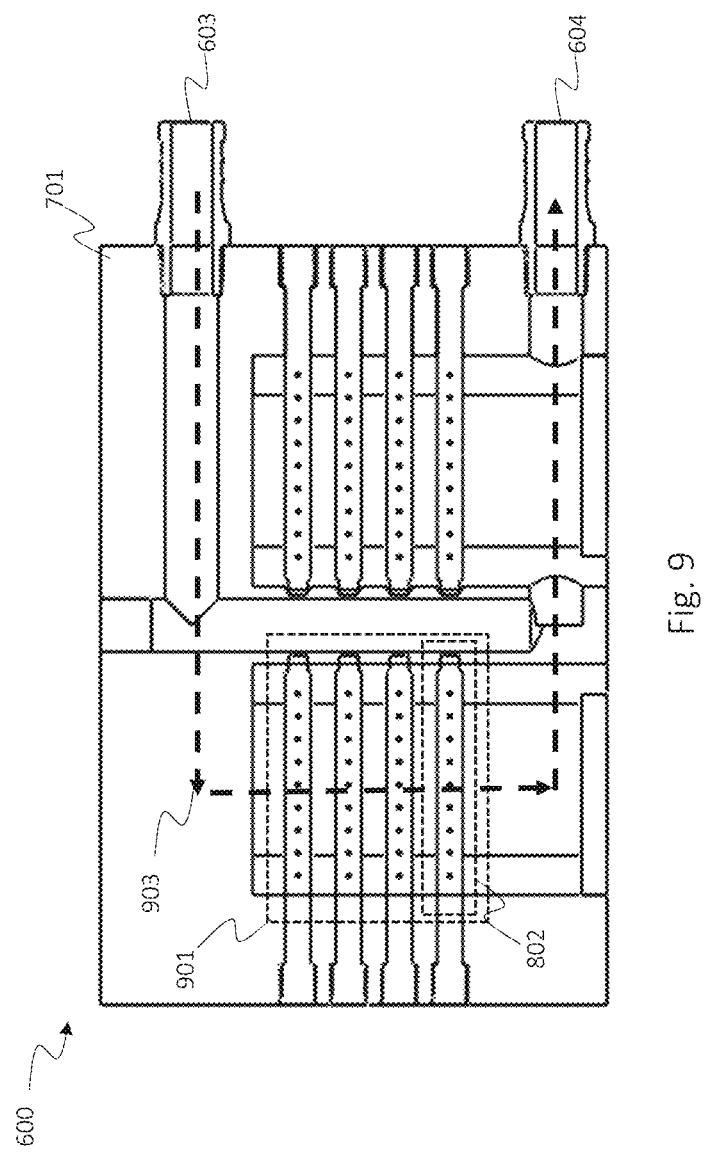
FIG. 9 illustrates an LCB configured to provide jetted flow according to an embodiment.

FIG. 9 illustrates a cross-section and flow of the liquid coolant inside an LCB configured to provide jetted flow according to an embodiment. Referring to FIG. 9, LCB first section 701 of LCB 600 includes a showerhead 901 located inside the fluid chamber. Liquid coolant entering the fluid inlet port 603 is routed to a showerhead 901. Each showerhead 901 includes an array of jetting apertures comprising one or more rows 802 of jetting apertures and 9 (nine) jetting apertures per row 802 as an example. Arrows 903 depict the directional flow of the liquid coolant. After the liquid coolant flows over the LCB second section 702 inside surface the liquid coolant is routed to the fluid outlet port 604.

Figure 10:
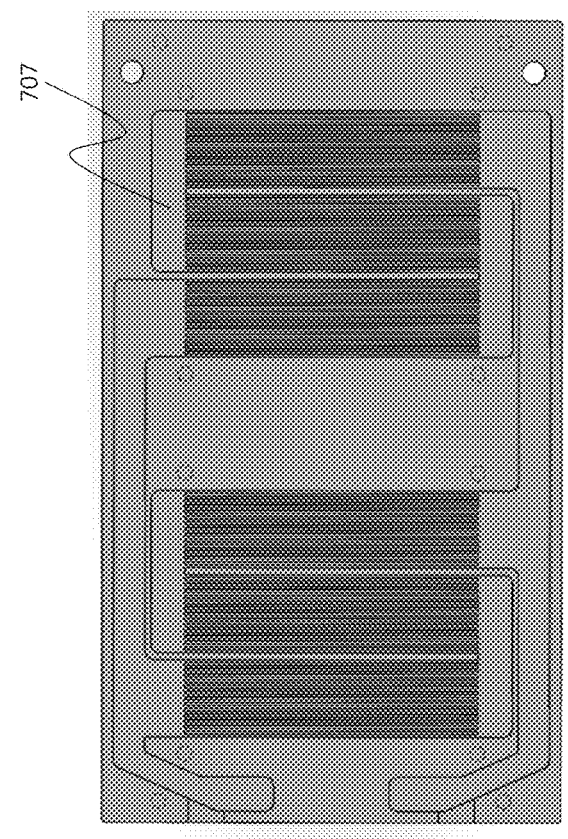
FIG. 10 illustrates an LCB configured to provide parallel flow according to an embodiment.
Figure 10:
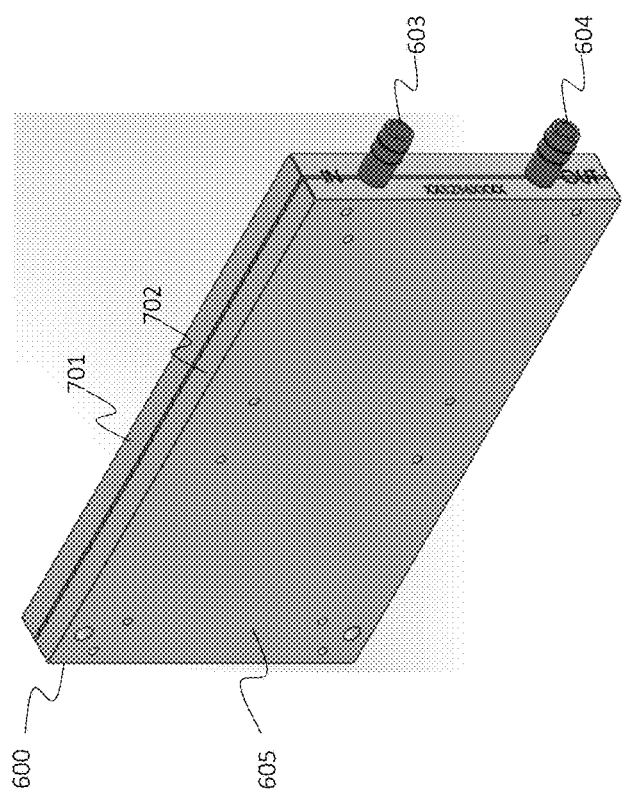

FIG. 10 illustrates a liquid cooling block configured to provide parallel flow according to an embodiment. One or more high-power switching modules 601 (previously described with respect to FIG. 6) may be mechanically fastened on the LCB planar outside surface 605 of LCB 600. For a LCB using parallel flow the liquid coolant flows from a parallel slot 707 in the LCB first section 701 of LCB 600 into the enclosed fluid chamber (not shown) and subsequently flows over the LCB second section 702 inside surface of LCB 600. After the liquid coolant flows over the LCB second section 702 inside surface the liquid coolant is routed to the fluid outlet port 604.

Figure 11:
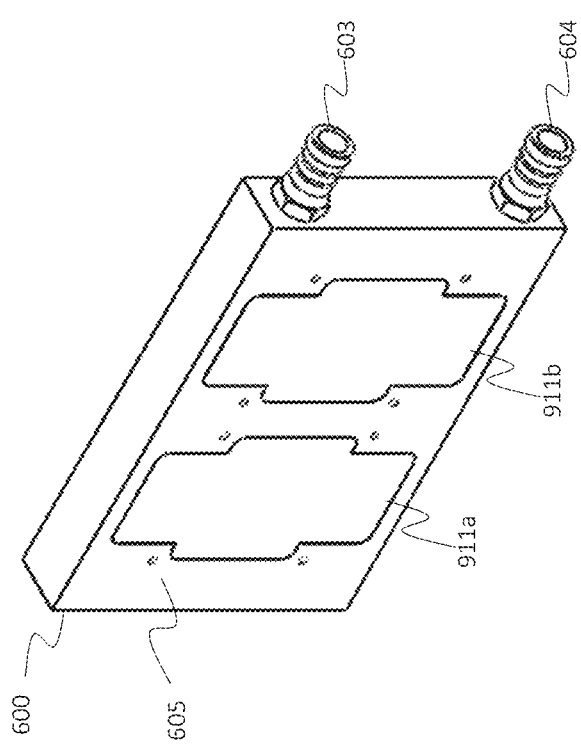
FIG. 11 illustrates an LCB for use with a cooling plate according to an embodiment.

FIG. 11 illustrates an LCB for use with a cooling plate according to an embodiment. In FIG. 11, LCB 600 includes an aperture 911 in the LCB second section 702. A cooling plate with a matching shape to the aperture is fit-mounted into the aperture 911 in the planar outside surface of the LCB second section 702 and may be welded, brazed or attached in other ways. One or more high-power switching modules 601 may be mounted on the planar outside surface of the LCB second section 702.

Figure 12:
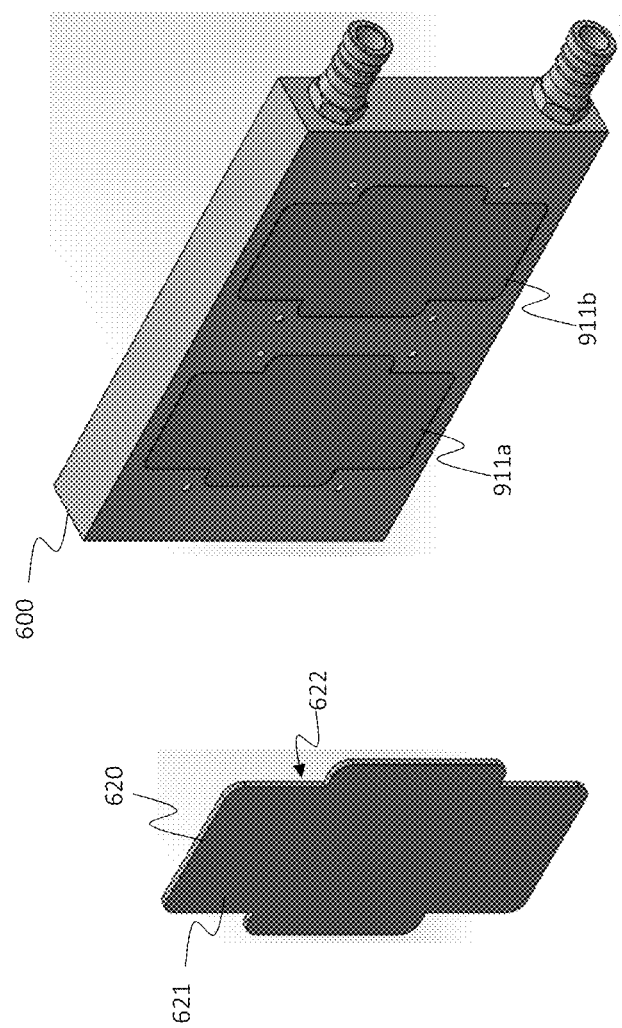
FIG. 12 illustrates an example cooling plate of an LCB according to an embodiment.

FIG. 12 illustrates an LCB cooling plate according to an embodiment. In FIG. 12, cooling plate 620 has a planar outward facing surface 621 and an inward facing patterned or unpatterned surface 622. When configured to provide jetted flow, jets of liquid coolant created by the LCB first section showerhead 901 are jetted onto the cooling plate inward facing patterned or unpatterned surface 622. When configured to provide parallel flow, the liquid coolant flows over the cooling plate inward facing patterned or unpatterned surface 622. A high-power switching module is thermally coupled to the cooling plate planar outward facing surface 605. Indirect impingement cooling occurs when the liquid coolant impinges onto the LCB second section inside surface, either jetted flow or parallel flow, such that heat is transferred from the power electronic module metal baseplate indirectly by the LCB second section to the liquid coolant via the enclosed fluid chamber.

Figure 13:
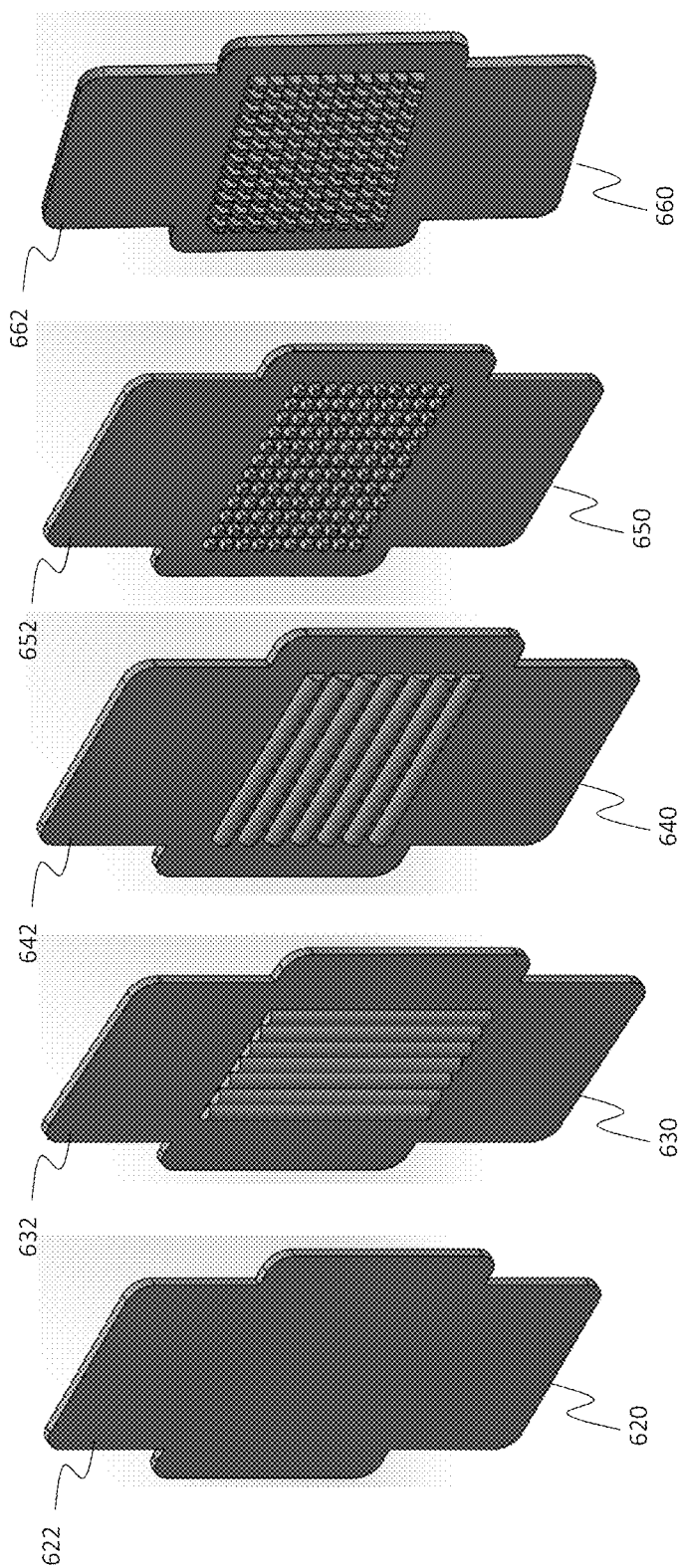
FIG. 13 illustrates different configurations of a cooling plate according to an embodiment.

The LCB planar outside surface 605 may be configured to provide an individualized flow using a cooling plate 620. FIG. 13 illustrates five LCB cooling plate configurations according to an embodiment. The cooling plate has a planar outward facing surface and an inward facing patterned or unpatterned surface. Patterned surfaces can be formed with embossed, raised or protruding features. For example, in a first cooling plate configuration using cooling plate 620, the inward facing surface 622 comprises an un-patterned flat surface. In a second cooling plate configuration using cooling plate 630, the inward facing surface 632 comprises embossed features (or patterns) having vertically oriented features. In a third cooling plate configuration using cooling plate 640, the inward facing surface 642 comprises embossed features (or patterns) having horizontally oriented features. In a fourth cooling plate configuration using cooling plate 650, the inward facing surface 652 comprises embossed features (or patterns) having square (or cube) oriented features. In a fifth cooling plate configuration using cooling plate 660, the inward facing surface 662 comprises embossed features having trapezoidal oriented features. In one embodiment, the trapezoidal oriented features each have four trapezoidal sides, and a square top face that is smaller in area than the base of the feature, so that the feature tapers, along each trapezoidal side, from base to top face. The embossed features increase the surface area on which the coolant jets impinge, thereby leading to improved heat transfer.

The teachings contained in the embodiments described herein may be applied to stand-alone high-power switching modules, inverters, voltage source converters and static synchronous series compensator systems. The foregoing description, for the purpose of explanation, has been described with reference to specific embodiments. However, the illustrative discussions above are not intended to be exhaustive or to limit the application to the precise forms disclosed. Many modifications and variations are possible in view of the above teachings. The embodiments were chosen and described to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the application is not to be limited to the details given herein but may be modified within the scope and equivalents of the appended claims.

What is claimed is:

1. A liquid cooling static synchronous series compensator (SSSC) system, comprising:
    a plurality of series connected inverter valve modules operable to inject reactive power into a power transmission line, with at least one of the plurality of inverter valve modules having voltage isolation relative to at least one other of the plurality of inverter valve modules;
    each inverter valve module including one or more inverter valve units attached to a liquid cooling block (LCB) having an enclosed fluid chamber;
    the liquid cooling block configurable, via a plurality of liquid cooling block sections and a plurality of cooling plates, to provide each of a jetted flow, a parallel flow, and an individualized flow, to provide liquid cooling to the inverter valve module under power transmission line operating conditions; and
    at least one liquid cooling block having voltage isolation relative to at least one other liquid cooling block of the liquid cooling SSSC system.

2. The liquid cooling SSSC system of claim 1, further comprising:
    the liquid cooling block having a clamshell construction including a first section and a second section that form the enclosed fluid chamber, wherein the liquid cooling block configurable via the plurality of liquid cooling block sections comprises differing such second sections in differing configurations of the liquid cooling block.

3. The liquid cooling SSSC system of claim 1, further comprising:
    the liquid cooling block having a fluid inlet port, a fluid outlet port and a planar outside surface.

4. The liquid cooling SSSC system of claim 3, wherein the one or more inverter valve units are attached and thermally coupled to the planar outside surface of the liquid cooling block.

5. The liquid cooling SSSC system of claim 1, wherein the liquid cooling block configurable to provide the jetted flow comprises a first one of the plurality of liquid cooling block sections including a showerhead having an array of jetting apertures to provide jets of liquid coolant onto a second one of the plurality of liquid cooling block sections, within the enclosed fluid chamber.

6. The liquid cooling SSSC system of claim 1, wherein the liquid cooling block configurable to provide the parallel flow comprises a first one of the plurality of liquid cooling block sections having a parallel slot to provide parallel flow of liquid coolant over an inside surface of a second one of the plurality of liquid cooling block sections, within the enclosed fluid chamber.

7. The liquid cooling SSSC system of claim 1, wherein the liquid cooling block configurable via the plurality of cooling plates to provide the individualized flow comprises one of the plurality of cooling plates having a planar outward facing surface and an inward facing patterned or unpatterned surface.

8. The liquid cooling SSSC system of claim 1, wherein the liquid cooling block configurable to provide the jetted flow comprises one of the plurality of liquid cooling block sections having a showerhead to provide jets of liquid coolant onto an inward facing patterned or unpatterned surface of one of the plurality of cooling plates.

9. The liquid cooling SSSC system of claim 1, wherein the liquid cooling block configurable to provide the parallel flow comprises one of the plurality of liquid cooling block sections to provide parallel flow of liquid coolant over an inward facing patterned or unpatterned surface of one of the plurality of cooling plates.

10. The liquid cooling SSSC system of claim 1, wherein one of the plurality of cooling plates has an inward facing surface having embossed features oriented in parallel across a width of the cooling plate.

11. The liquid cooling SSSC system of claim 1, wherein one of the plurality of cooling plates has an inward facing surface having embossed features oriented in parallel along a length of the cooling plate.

12. The liquid cooling SSSC system of claim 1, wherein one of the plurality of cooling plates as an inward facing surface having embossed, square-oriented features.

13. The liquid cooling SSSC system of claim 1, wherein one of the plurality of cooling plates as an inward facing surface having trapezoidal-sided protrusion features.

14. A liquid cooling static synchronous series compensator (SSSC) system, comprising:
    a plurality of series-connectable inverter valve modules;
        each inverter valve module including at least one inverter valve unit and at least one liquid cooling block;
        each inverter valve module having voltage isolation relative to each other inverter valve module;
        the at least one liquid cooling block of each inverter valve module having voltage isolation relative to the at least one liquid cooling block of each other inverter valve module of the liquid cooling SSSC system; and the at least one liquid cooling block configured to provide a flow within an enclosed fluid chamber, for liquid cooling the at least one inverter valve unit, from among a jetted flow, a parallel flow, and an individualized flow, to provide liquid cooling to the inverter valve module under power transmission line operating conditions.

15. The liquid cooling SSSC system of claim 14, wherein each such cooling block is configured to provide the jetted flow within the enclosed fluid chamber through a showerhead having an array of jetting apertures to provide jets of liquid coolant onto an inside surface of the cooling block.

16. The liquid cooling SSSC system of claim 14, wherein the at least one cooling block is configured to provide the parallel flow within the enclosed fluid chamber through a parallel slot to provide parallel flows of liquid coolant over an inside surface of the cooling block.

17. The liquid cooling SSSC system of claim 14, wherein the at least one cooling block is configured to provide the individualized flow by having a cooling plate with an inward facing unpatterned surface.

18. The liquid cooling SSSC system of claim 14, wherein the at least one cooling block is configured to provide the individualized flow by having a cooling plate with an inward facing surface having raised parallel features.

19. The liquid cooling SSSC system of claim 14, wherein the at least one cooling block is configured to provide the individualized flow by having a cooling plate with an inward facing surface having a plurality of raised features each having at least one square face.

* * * * *